US012279493B2

(12) United States Patent
Nishiyama (10) Patent No.: US 12,279,493 B2
(45) Date of Patent: Apr. 15, 2025

(54) DISPLAY DEVICE

(71) Applicant: Sharp Kabushiki Kaisha, Osaka (JP)

(72) Inventor: Takayuki Nishiyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 353 days.

(21) Appl. No.: 17/765,602

(22) PCT Filed: Oct. 2, 2019

(86) PCT No.: PCT/JP2019/038937
§ 371 (c)(1),
(2) Date: Mar. 31, 2022

(87) PCT Pub. No.: WO2021/064902
PCT Pub. Date: Apr. 8, 2021

(65) Prior Publication Data
US 2022/0367597 A1    Nov. 17, 2022

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/131; H10K 59/1213; H10K 59/1216; G09G 2320/0233; G09G 2320/0238; G09G 3/3233
See application file for complete search history.

(56) References Cited

U.S. PATENT DOCUMENTS

| 9,412,307 | B2 * | 8/2016 | Kwon ................. G09G 3/3266 |
| 10,297,205 | B2 * | 5/2019 | Hwang ............... G09G 3/3291 |
| 10,672,345 | B2 * | 6/2020 | Xiang ................. G09G 3/3233 |
| 11,699,392 | B2 * | 7/2023 | Nishiyama .......... G09G 3/3233 |
| | | | 345/690 |

(Continued)

FOREIGN PATENT DOCUMENTS

JP    2014-044316 A    3/2014

OTHER PUBLICATIONS

Official Communication issued in International Patent Application No. PCT/JP2019/038937, mailed on Nov. 26, 2019.

*Primary Examiner* — Kyoung Lee
*Assistant Examiner* — Sophia W Kao
(74) *Attorney, Agent, or Firm* — Keating & Bennett, LLP (57) ABSTRACT

An organic EL display device includes the following: scanning line; data lines intersecting with the scanning lines; initialization lines; sub-pixel circuits provided to correspond to points of intersection between the scanning lines and data lines; and organic EL elements OLED provided to correspond to the sub-pixel circuits. The scanning signal lines, the data signal lines, the initialization power-source lines, the sub-pixel circuits and the light emitters are arranged in matrix in a display region. Each of the sub-pixel circuits includes the following: a drive transistor; a write transistor connecting a corresponding one of the data lines and the drive transistor together; a capacitor connected to the drive transistor and retaining a data signal; and a diode-connection transistor and an initialization transistor both connected between the drive transistor and a corresponding one of the initialization lines.

13 Claims, 5 Drawing Sheets

(56) References Cited

U.S. PATENT DOCUMENTS

2005/0243076 A1* 11/2005 Kim .................... G09G 3/3233
345/204
2017/0337875 A1* 11/2017 Jeon ................... H10K 59/1213
2019/0295469 A1* 9/2019 Umezawa ............ G09G 3/3233

* cited by examiner

DISPLAY DEVICE

TECHNICAL FIELD

The disclosure relates to a display device that includes current-driven electro-optic elements, and particularly to an active-matrix display device.

BACKGROUND ART

Current-driven organic EL elements are well known as electro-optic elements constituting matrix-arranged pixels. Display devices that include an organic electroluminescence (EL) in the pixels have been increasingly developed recently, because such a display device permits upsizing and slimming down of a display incorporating the display device, and because attention has been given to the vividness of an image displayed by the display device.

In particular, an active-matrix display device has been often developed that includes, in each pixel, a current-driven electro-optic element together with switching elements (such as TFTs or thin-film transistors) that are controlled individually, so that the electro-optic element is controlled for each pixel. This is because that such an active-matrix display device offers higher-/definition image display than a passive display device.

Here, an active-matrix display device has a connection line extending horizontally and provided for each row, a data line extending vertically and provided for each column, and a power source line extending vertically and provided for each column. Each pixel includes an electro-optic element, a connection transistor, a drive transistor, and a capacitor. Applying a voltage to the connection line turns on the connection transistor, and charging a data voltage (data signal) on the data line into the capacitance can write data. Then, applying the data voltage charged in the capacitor turns on the drive transistor to feed a current from the power source line into the electro-optic element, thus enabling the pixel to emit light.

Accordingly, an active-matrix organic EL display that has organic EL elements is configured such that voltage applied across the drive transistor regulates the value of current flowing through the organic EL element of each pixel, thus offering light emission at desired brightness, thus achieving gradation expression in each pixel. Moreover, the current that is fed through each organic EL element needs to be small in order for the organic EL display device to display an image at low brightness, and the organic EL display device hence has a sub-threshold region where the gate-source voltage of the drive transistor stands at equal to or smaller than a threshold.

CITATION LIST

Patent Literature

Patent Literature 1: Japanese Unexamined Patent Application Publication No. 2014-44316

SUMMARY

Technical Problem

The sub-threshold of the drive transistor unfortunately has a characteristic where the current value changes abruptly with a change in gate voltage, and where a gate voltage difference, which is provided for expressing the difference of a single gradation, can be smaller than the increments in a data driver, which supplies the data voltage. Favorable gradation is hence difficult to express. In addition, variations in the characteristic of the drive transistor affect the gradation expression in each pixel, thus causing gradation unevenness unfortunately.

It is an object of the disclosure to provide a display device that can reduce the influence of variations in the characteristic of a drive transistor, and that can achieve favorable gradation expression at even low brightness.

Solution to Problem

To solve the above problem, a display device according to a first aspect of the disclosure includes the following: scanning signal lines; data signal lines intersecting with the scanning signal lines; initialization power-source lines; sub-pixel circuits provided to correspond to points of intersection between the scanning signal lines and the data signal lines; and light emitters provided to correspond to the sub-pixel circuits. The scanning signal lines, the data signal lines, the initialization power-source lines, the sub-pixel circuits and the light emitters are arranged in matrix in a display region. Each of the sub-pixel circuits includes the following: a drive transistor; a write transistor connecting a corresponding one of the data signal lines and the drive transistor together; a capacitor connected to the drive transistor and retaining a data signal; and a diode-connection transistor and an initialization transistor both connected between the drive transistor and a corresponding one of the initialization power-source lines.

In the foregoing configuration, the diode-connection transistor is on an initialization current path extending from the drive transistor to the initialization power-source line. This can increase the circuit's S value when the source potential of the drive transistor is initialized. The relationship between the gate voltage and current value in the sub-threshold characteristic of the drive transistor is consequently adjusted, thus offering the current value that is changed gently by a change in the gate voltage. This can reduce the influence of variations in the characteristic of the drive transistor and can achieve favorable gradation expression at even low brightness.

The display device may be configured such that the diode-connection transistor is connected between the initialization transistor and the corresponding initialization power-source line.

The display device may be configured such that the diode-connection transistor is connected between the drive transistor and the initialization transistor.

The display device may be configured such that the corresponding initialization power-source line is connected to the back gate of the drive transistor.

The display device may be configured such that the source of the diode-connection transistor is connected to the back gate of the drive transistor.

The display device may be configured such that a plurality of the diode-connection transistors are arranged between the initialization transistor and the corresponding initialization power-source line The display device may be configured such that a plurality of the diode-connection transistors are arranged between the drive transistor and the initialization transistor.

To solve the above problem, a display device according to a second aspect of the disclosure includes the following: scanning signal lines; data signal lines intersecting with the scanning signal lines; initialization power-source lines; sub-pixel circuits provided to correspond to points of intersection between the scanning signal lines and the data signal lines; and light emitters provided to correspond to the sub-pixel circuits. The scanning signal lines, the data signal lines, the initialization power-source lines, the sub-pixel circuits and the light emitters are arranged in matrix in a display region. Each of the sub-pixel circuits includes the following: a drive transistor; a write transistor connecting a corresponding one of the data signal lines and the drive transistor together; a capacitor connected to the drive transistor and retaining a data signal; and an initialization transistor connected between the drive transistor and a corresponding one of the initialization power-source lines. A diode-connection transistor is connected between the corresponding initialization power-source line and an initialization power-source terminal.

In the foregoing configuration, the diode-connection transistor is on an initialization current path extending from the drive transistor to the initialization power-source terminal. This can increase the circuit's S value when the source potential of the drive transistor is initialized. The relationship between the gate voltage and current value in the sub-threshold characteristic of the drive transistor is consequently adjusted, thus offering the current value that is changed gently by a change in the gate voltage. This can reduce the influence of variations in the characteristic of the drive transistor and can achieve favorable gradation expression at even low brightness.

The display device may be configured such that the initialization power-source lines are arranged so as to be in parallel to and one-to-one correspond to the data signal lines, and such that the initialization power-source lines are individually connected to an initialization power-source trunk wire via diode-connection transistors provided so as to one-to-one correspond to the initialization power-source lines.

The display device may be configured such that a plurality of the diode-connection transistors are arranged between the corresponding initialization power-source line and the initialization power-source terminal The display device may be configured such that a common one of the scanning signal lines is connected to the data gate of the write transistor and the data gate of the initialization transistor.

The display device further includes a scanning drive circuit that outputs a drive signal to the scanning signal lines. When the data signal is written, the scanning drive circuit inputs a drive signal to a scanning signal line to turn on the write transistor and the initialization transistor. When the data signal is written, the source of the drive transistor and the initialization power source are connected together via the diode-connection transistor.

Advantageous Effect of Invention

The display devices in the disclosure can reduce the influence of variations in the characteristic of their drive transistors and can achieve favorable gradation expression at even low brightness.

DESCRIPTION OF EMBODIMENTS

First Embodiment

Figure 1:
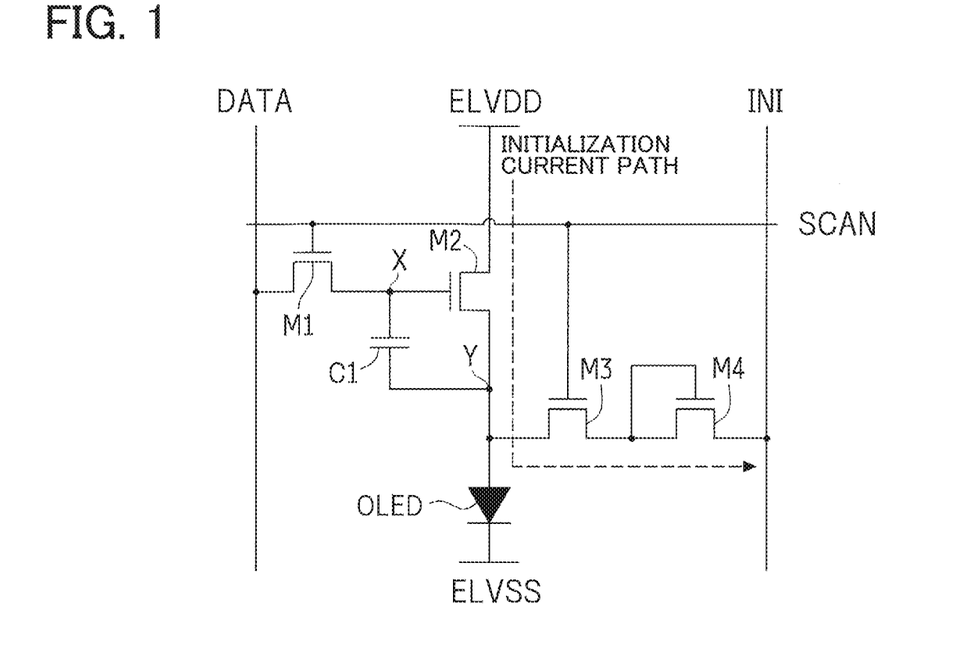
FIG. 1 is a pixel circuit diagram illustrating a pixel of an organic EL display device according to a first embodiment.

A first embodiment of the disclosure will be detailed with reference to the drawings. In the Description and drawings, components having substantially the same functions and configurations will be denoted by the same signs, and the description of redundancies will be omitted. FIG. 1 is a pixel circuit diagram illustrating a pixel of an organic EL display device according to the first embodiment.

The organic EL display, which is an active-matrix type, includes the following, as illustrated in FIG. 1: a scanning line (scanning signal line) SCAN extending horizontally and provided for each row; a high-level power-source line ELVDD extending horizontally and provided for each row; a low-level power-source line ELVSS extending horizontally and provided for each row; a data line (data signal line) DATA extending vertically and provided for each column; and an initialization line (initialization power-source line) INI extending vertically and provided for each column. Although extending vertically, the initialization line INI may extend horizontally.

The organic EL display device has a display region. The display region includes sub-pixel circuits arranged in matrix so as to correspond to the points of intersection between the scanning lines SCAN and data lines DATA, and the display region includes organic EL elements (light emitters) OLED arranged in matrix so as to correspond to the sub-pixel circuits. That is, each organic EL element OLED is driven through the corresponding sub-pixel circuit. Each sub-pixel circuit includes a write transistor M1, a drive transistor M2, an initialization transistor M3, a diode-connection transistor M4, and a capacitor C1.

The write transistor M1 connects the data line DATA and drive transistor M2 together. To be specific, the write transistor M1 has a gate connected to the scanning line SCAN, a drain connected to the data line DATA, and a source connected to the gate (data gate), a control terminal, of the drive transistor M2. The drive transistor M2 has a drain connected to the high-level power-source line ELVDD, and a source connected to the anode of the organic EL element OLED. The organic EL element OLED has a cathode connected to the low-level power-source line ELVSS. The capacitor C1 is connected between nodes X and Y. The node X is disposed between the source of the write transistor M1 and the gate of the drive transistor M2, and the node Y is disposed between the source of the drive transistor M2 and the anode of the organic EL element OLED.

The initialization transistor M3 and the diode-connection transistor M4 are connected in series between the source of the drive transistor M2 and the initialization line INI. The circuit shown in FIG. 1 is configured such that the initialization transistor M3 is located close to the drive transistor M2, and such that the diode-connection transistor M4 is located close to the initialization line INI. To be specific, the initialization transistor M3 has a gate connected to the scanning line SCAN, which receives the same scanning signal as the write transistor M1, and a drain connected to the source of the drive transistor M2 and to the anode of the organic EL element OLED, and a source connected to the drain of the diode-connection transistor M4. The diode-connection transistor M4 has a source connected to the initialization line INI. The gate and drain of the diode-connection transistor M4 are short-circuited, and this configuration is typically known as the diode connection of a transistor.

The pixel shown in FIG. 1 is configured such that the scanning line SCAN, connected to a scanning drive circuit during data write, is brought into a high (H) state by a scanning signal (drive signal), thus turning on the initialization transistor M3 and write transistor M1. At this time, upon the turning-on of the write transistor M1, the capacitor C1 receives data from the data line DATA as voltage applied to both the nodes X and Y.

Furthermore, the initialization transistor M3 is turned on at the time of the data write, thus initializing the source potential of the transistor M2. At the time of the data write, current flows through a path (initialization current path) that starts with the high-level power-source line ELVDD, followed by the drive transistor M2, followed by the initialization transistor M3, followed by the diode-connection transistor M4, followed by the initialization line INI.

When the diode-connection transistor M4 is located on this initialization current path, the resistance of the diode-connection transistor M4 causes a voltage drop, thus establishing Vy>Vini. Here, Vy denotes the potential of the node Y, and Vini denotes the potential of the initialization line INI.

That is, the initialization current path shown in FIG. 1 includes the diode-connection transistor M4, thus reducing Vgs (gate-source voltage) of the drive transistor M2. This degrades the capability of current drive of the drive transistor M2.

The scanning line SCAN is brought into a low (L) state during the light emission of the organic EL element OLED, thus turning off the write transistor M1 and initialization transistor M3. The node X at this time is brought into a floating state, but Vgs of the drive transistor M2 during the light emission is kept almost constant because the node X is joined to the node Y via the capacitor C1.

The S value (sub-threshold coefficient) of the circuit shown in FIG. 1 is expressed by the following expression:

$$S=(1+gm2/gm4)/gm2.$$

The S value expressed by this expression is (1+gm2/gm4) times greater than the S value with no diode-connection transistor M4 provided. The S value is provided by reflecting that the initialization transistor M3 is a switching transistor and has transmission conductance that is sufficiently larger than the transmission conductance of the write transistor M1 and the transmission conductance of the diode-connection transistor M4. Here, gm2 denotes the transmission conductance of the drive transistor M2, and gm4 denotes the transmission conductance of the diode-connection transistor M4. That is, the S value doubles when the characteristics of the drive transistor M2 and diode-connection transistor M4 are equivalent.

As described above, the circuit shown in FIG. 1, which includes the diode-connection transistor M4 on the initialization current path, can increase the circuit's S value when compared to a circuit that includes no diode-connection transistor M4. The relationship between the gate voltage and current value in the sub-threshold characteristic of the drive transistor M2 is consequently adjusted, thus offering the current value that is changed gently by a change in the gate voltage. This can reduce the influence of variations in the characteristic of the drive transistor M2 and can achieve favorable gradation expression at even low brightness.

Second Embodiment

Figure 2:
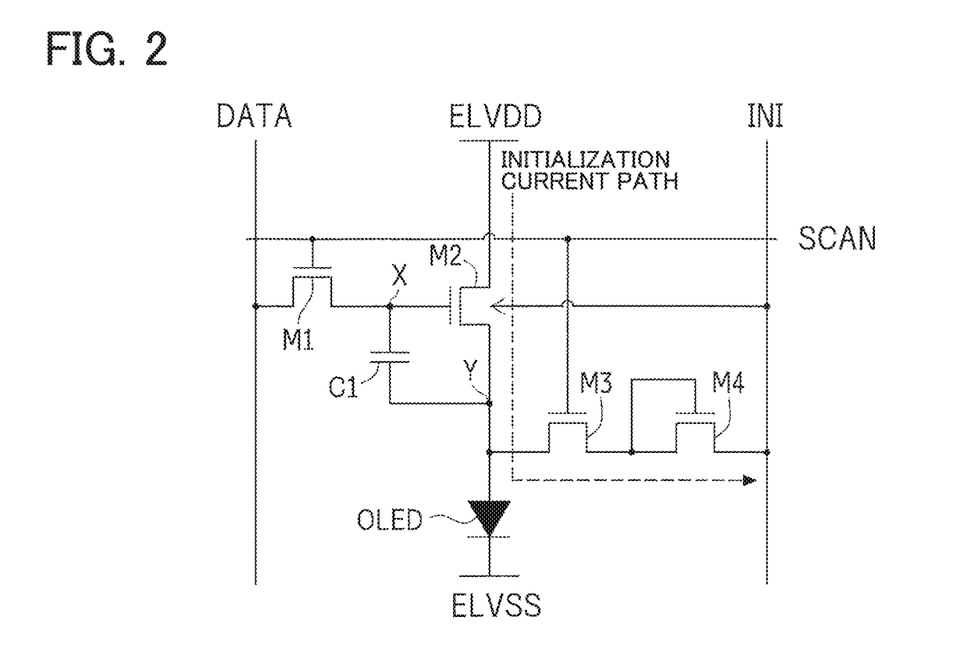
FIG. 2 is a pixel circuit diagram illustrating a pixel of an organic EL display device according to a second embodiment.

FIG. 2 is a pixel circuit diagram illustrating a pixel of an organic EL display device according to a second embodiment.

The circuit shown in FIG. 2 is different from the circuit shown in FIG. 1 in that the source potential of the diode-connection transistor M4 is input to the back gate of the drive transistor M2. In the circuit shown in FIG. 2, the source of the diode-connection transistor M4 is connected to the initialization line INI, and thus the potential of the initialization line INI can be regarded as being input to the back gate of the drive transistor M2. The circuit shown in FIG. 2 can thus offer a greater S value.

The data gate of a transistor refers to a gate electrode that receives a data voltage, and the back gate of the transistor refers to a gate electrode that is opposite to the data gate. In a structure where a gate electrode is disposed above and under a semiconductor layer with gate insulating films interposed therebetween for instance, the bottom gate electrode serves as a back gate when the top gate electrode is a data gate, and the top gate electrode serves as a back gate when the bottom gate electrode is a data gate. A data gate is hereinafter referred also to as a gate merely.

The S value of the circuit shown in FIG. 2 is expressed by the following expression:

$$S=(1+(1+a)\cdot gm2/gm4)/gm2.$$

For easy description, let the characteristic of the drive transistor M2 and the characteristic of the diode-connection transistor M4 be equivalent (i.e., gm2=gm4); accordingly, the S value of the circuit shown in FIG. 2 is (2+a) times greater than the S value with no diode-connection transistor M4 provided. Here, a denotes a back-gate control coefficient, and to be specific, a is expressed as $a=C_{BGI}/C_{GI}$, where $C_{BGI}$ denotes the back gate capacitance of a transistor, where $C_{GI}$ denotes the drive gate capacitance of the transistor. Upon input of a voltage Vb to the back gate, the threshold of the drive transistor M2 is shifted by an amount expressed by the following expression:

$$\Delta Vth=a(Vb-Vs).$$

At this time, Vs denotes the source potential of the drive transistor M2.

As described above, the circuit shown in FIG. 2 can increase the circuit's S value further than the circuit shown in FIG. 1. This offers a current value that is changed more gently by a change in gate voltage, thereby achieving favorable gradation expression at even low brightness.

Third Embodiment

Figure 3:
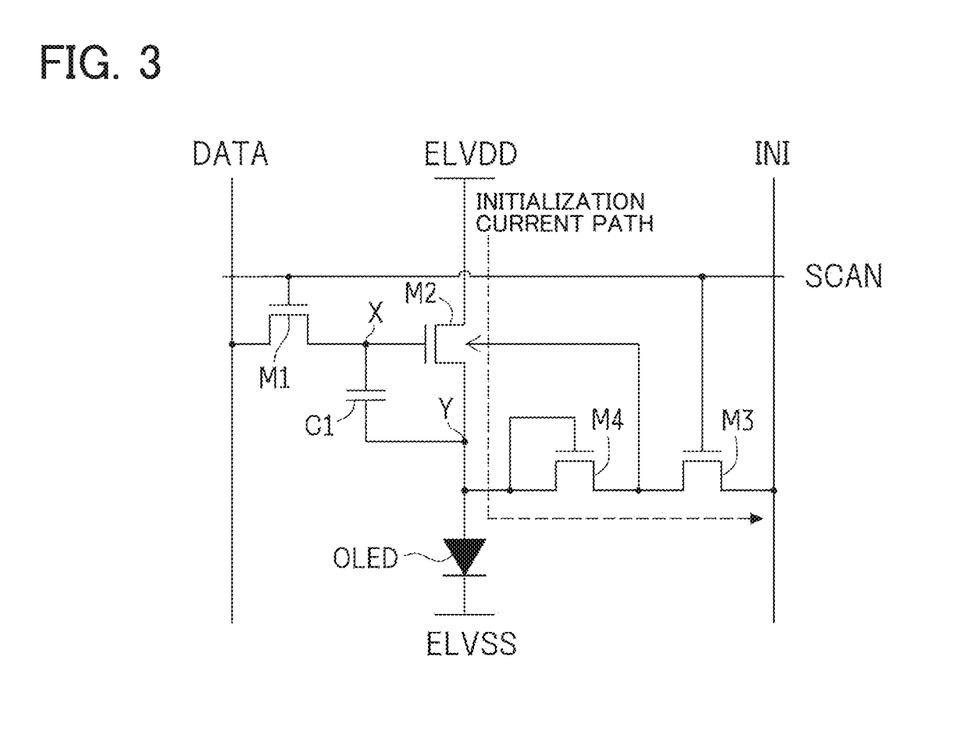
FIG. 3 is a pixel circuit diagram illustrating a pixel of an organic EL display device according to a third embodiment.

FIG. 3 is a pixel circuit diagram illustrating a pixel of an organic EL display device according to a third embodiment.

The circuit shown in FIG. 3 is different from the circuit shown in FIG. 1 in that the order of connection of the initialization transistor M3 and diode-connection transistor M4 is inverted. That is, the diode-connection transistor M4 is located close to the drive transistor M2, and the initialization transistor M3 is located close to the initialization line INI. The circuit shown in FIG. 3 is configured such that the source potential of the diode-connection transistor M4 is input to the back gate of the drive transistor M2.

The circuit shown in FIG. 3, which includes the initialization transistor M3 disposed between the diode-connection transistor M4 and initialization line INI, eliminates fluctuations in the threshold of the drive transistor M2, which is caused by fluctuations in the potential of the initialization line INI, thereby stabilizing the brightness of the organic EL element OLED.

Figure 4:
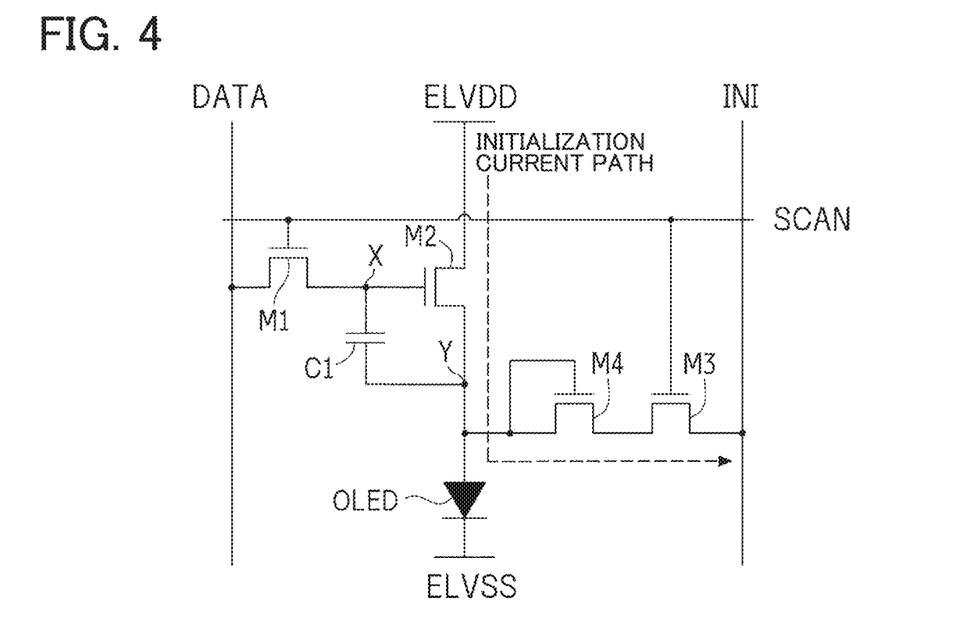
FIG. 4 illustrates a modified version of the organic EL display device according to the third embodiment and is a pixel circuit diagram illustrating a pixel.
Figure 5:
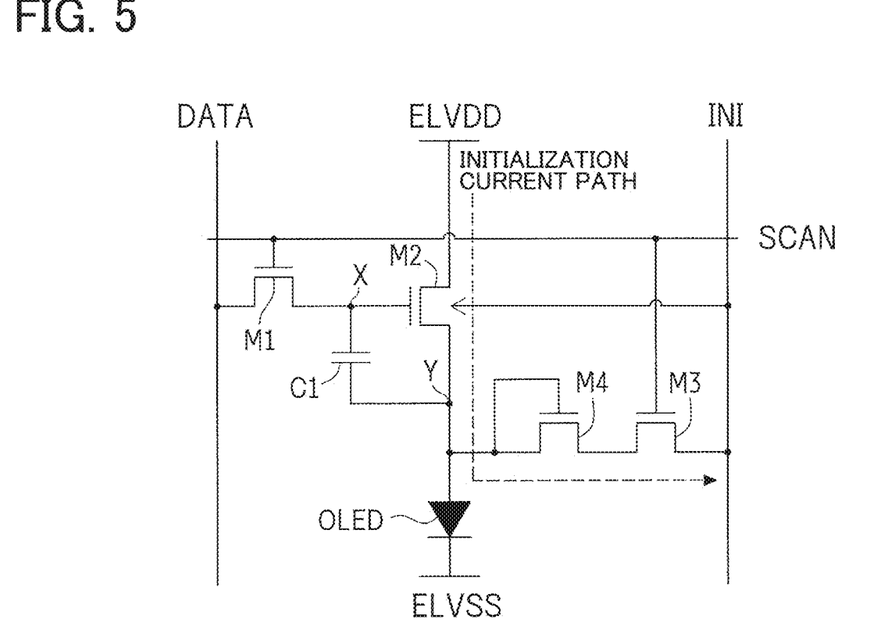
FIG. 5 illustrates a modified version of the organic EL display device according to the third embodiment and is a pixel circuit diagram illustrating a pixel.

FIGS. 4 and 5 each illustrate a modified pixel circuit of the organic EL display device according to the third embodiment.

The circuit shown in FIG. 3 is configured such that the source potential of the diode-connection transistor M4 is input to the back gate of the drive transistor M2. Let the characteristic of the drive transistor M2 and the characteristic of the diode-connection transistor M4 be equivalent; accordingly, the S value of the circuit shown in FIG. 3 is (2+a) times greater than the S value with no diode-connection transistor M4 provided, like the circuit shown in FIG. 2.

In contrast, the circuit shown in FIG. 4 is configured such that no potential is input to the back gate of the drive transistor M2 (i.e., the drive transistor M2 has no back gate). Let the characteristic of the drive transistor M2 and the characteristic of the diode-connection transistor M4 be equivalent; accordingly, the S value of the circuit shown in FIG. 4 doubles the S value with no diode-connection transistor M4 provided, like the circuit shown in FIG. 1. That is, the S value of the circuit shown in FIG. 4 is expressed by the following expression:

$$S=(1+gm2/gm4)/gm2.$$

The circuit shown in FIG. 5 is configured such that the potential of the initialization line INI is input to the back gate of the drive transistor M2. Let the characteristic of the drive transistor M2 and the characteristic of the diode-connection transistor M4 be equivalent; accordingly, the S value of the circuit shown in FIG. 5 is (2+a) times greater than the S value with no diode-connection transistor M4 provided, like the circuits shown in FIGS. 2 and 3. That is, the S value of the circuit shown in FIG. 5 is expressed by the following expression:

$$S=(1+(1+a)\cdot gm2/gm4)/gm2.$$

Fourth Embodiment

Figure 6:
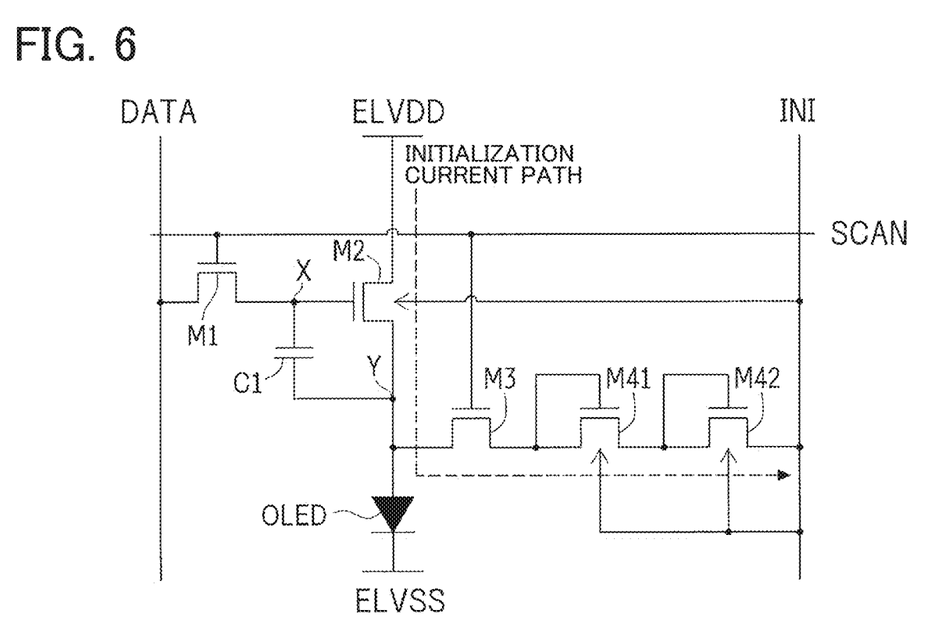
FIG. 6 is a pixel circuit diagram illustrating a pixel of an organic EL display device according to a fourth embodiment.

FIG. 6 is a pixel circuit diagram illustrating a pixel of an organic EL display device according to a fourth embodiment.

The circuit shown in FIG. 6 is different from the circuit shown in FIG. 2 in that a multi-stage diode-connection transistor is provided as the source load of the drive transistor M2. That is, the circuit shown in FIG. 6 includes two diode-connection transistors M41 and M42 connected between the initialization transistor M3 and initialization line INI. Although the foregoing multi-stage diode-connection transistor consists of two diode-connection transistors by way of example, a multi-stage diode-connection transistor consisting of three or more diode-connection transistors may be provided.

The circuit shown in FIG. 6 is configured such that the source potential of the diode-connection transistor M42 (in other words, the potential of the initialization line INI) is input to the back gates of the diode-connection transistors M41 and M42. Inputting a constant potential to the back gates of the diode-connection transistors M41 and M42 can avoid the diffraction of an electric field, thus improving the saturation of a MOSFET. This configuration may be applied to the diode-connection transistor M4 shown in FIGS. 1 to 5. In addition, the diode-connection transistors M41 and M42 in FIG. 6 may have no back gate.

Let the characteristic of the drive transistor M2 and the characteristic of the diode-connection transistors M41 and M42 be equivalent; accordingly, the S value of the circuit shown in FIG. 6 is $(3+3a+a^2)$ times greater than the S value with no diode-connection transistors M41 and M42 provided. As described above, the circuit shown in FIG. 6 can increase the circuit's S value and can thus offer a current value that is changed gently by a change in gate voltage, thereby achieving favorable gradation expression at even low brightness.

Fifth Embodiment

Figure 7:
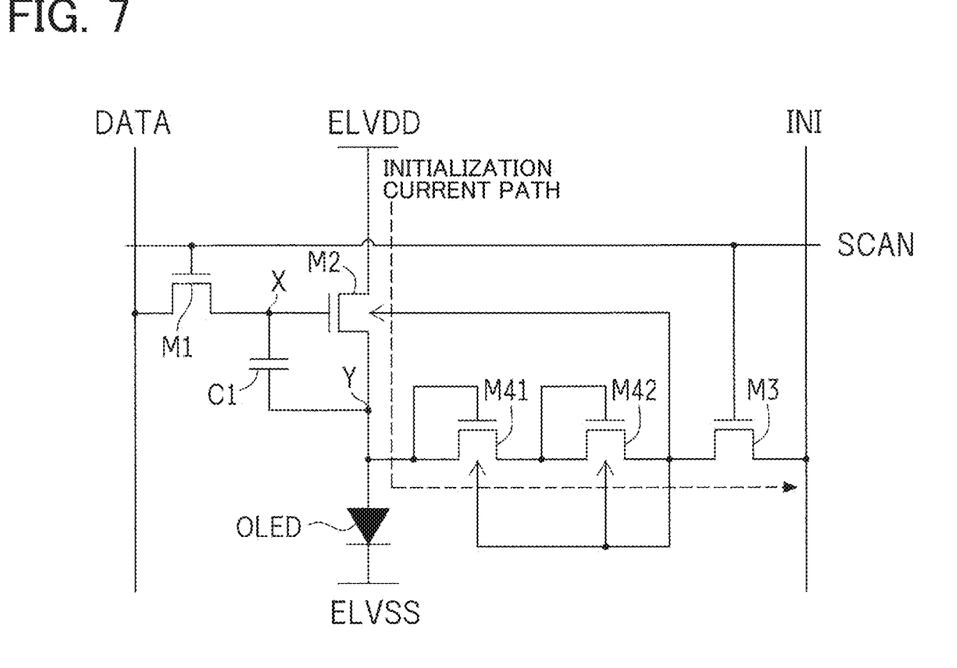
FIG. 7 is a pixel circuit diagram illustrating a pixel of an organic EL display device according to a fifth embodiment.

FIG. 7 is a pixel circuit diagram illustrating a pixel of an organic EL display device according to a fifth embodiment.

The circuit shown in FIG. 7 is different from the circuit shown in FIG. 6 in that the order of connection of the initialization transistor M3 and diode-connection transistors M41 and M42 is inverted. That is, the diode-connection transistors M41 and M42 are located close to the drive transistor M2, and the initialization transistor M3 is located close to the initialization line INI. Let the characteristic of the drive transistor M2 and the characteristic of the diode-connection transistors M41 and M42 be equivalent; accordingly, the S value of the circuit shown in FIG. 7 is (3+3a+a2) times greater than the S value with no diode-connection transistors M41 and M42 provided.

In addition to the effect of the circuit shown in FIG. 6, the circuit shown in FIG. 7 can stabilize the brightness of the organic EL element OLED, like the circuit shown in FIG. 3.

In some embodiments, the circuit shown in FIG. 7 may be configured such that the diode-connection transistors M41 and M42 have no back gate or may be configured such that the diode-connection transistors M41 and M42 are connected to the initialization line INI.

Sixth Embodiment

Figure 8:
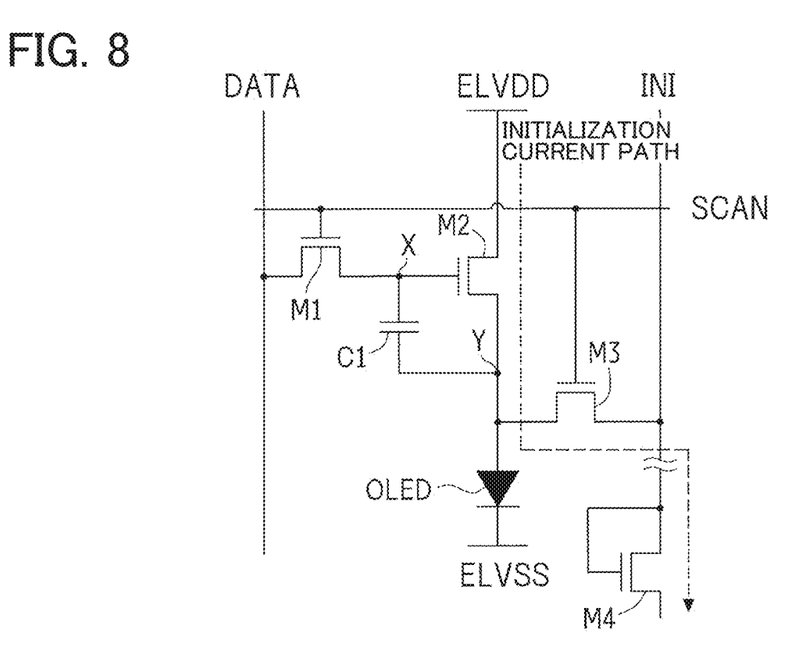
FIG. 8 is a pixel circuit diagram illustrating a pixel of an organic EL display device according to a sixth embodiment.

FIG. 8 is a pixel circuit diagram illustrating a pixel of an organic EL display device according to a sixth embodiment.

The display devices according to the first to fifth embodiments are configured such that the diode-connection transistor M4 (or M41 and M42), which constitutes the source load of the drive transistor M2, is included within each pixel. The source load of the drive transistor M2 does not necessarily have to be located within each pixel, and the source load needs to be located on the initialization current path.

The circuit shown in FIG. 8 is different from the circuit shown in FIG. 1 in that the diode-connection transistor M4 is connected at a different location. That is, the diode-connection transistor M4 is located not within the pixel, but at the proximal end of the initialization line INI. In other words, the diode-connection transistor M4 is connected between the initialization line INI and an initialization power-source terminal, which connects the initialization line INI to a driver IC. The diode-connection transistor M4 is thus shared with pixels in other rows connected to the same initialization line INI. The circuit shown in FIG. 8 is configured such that only the initialization transistor M3 is connected between the source of the drive transistor M2 and the initialization line INI. In some embodiments, the diode-connection transistor M4 may be disposed on the same TFT substrate as the pixel circuit or may be mounted on the driver IC.

Referring to the initialization current path, the circuit shown in FIG. 8 is configured such that the diode-connection transistor M4, which constitutes a dynamic load, is disposed close to the source of the drive transistor M2, thereby turning the initialization circuit into a source follower. Accordingly, the dynamic load raises the potential of the source (=the node Y) of the drive transistor M2 when a data voltage is written into the node X in a selected row. The potential of the node Y rises at this time dynamically in accordance with the volume of initialization current, thereby providing an IV curve with a small slope.

Figure 9:
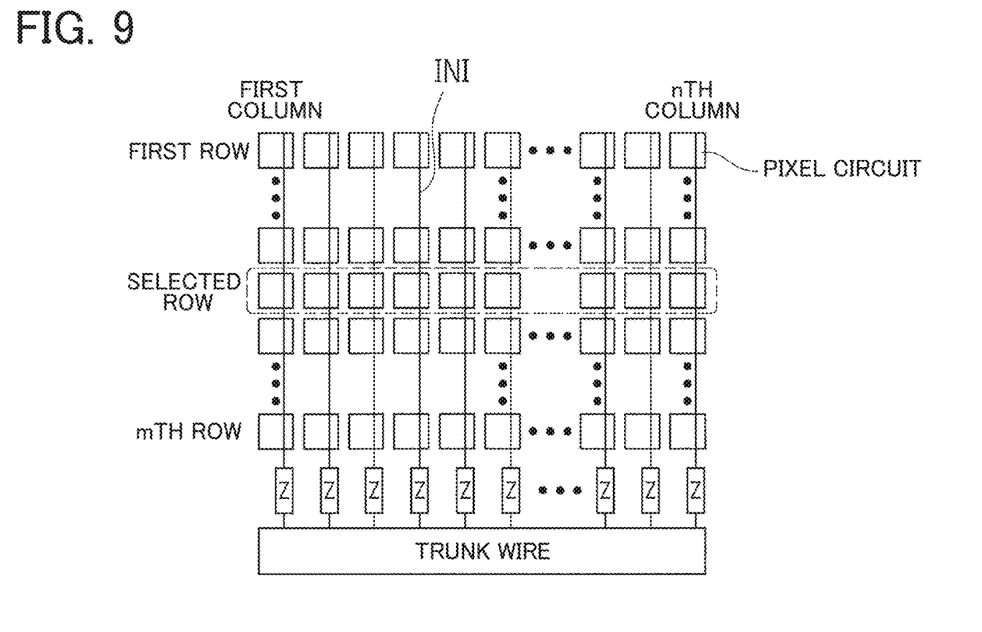
FIG. 9 schematically illustrates the configuration of the organic EL display device according to the sixth embodiment.

Herein, a single initialization line INI is provided for each pixel column, as illustrated in FIG. 9. In other words, the initialization lines INI are arranged so as to be in parallel to and one-to-one correspond to the data lines DATA (not shown in FIG. 9). That is, in a pixel arrangement consisting of R, G, and B, the initialization line INI is provided for each of the pixel columns of R, G, and B.

The organic EL display device has a frame region (a region between its drive region and driver IC) including a plurality of initialization lines INI connected to an initialization power-source trunk wire and shared in the row direction. The initialization lines INI in different columns are independent. Each initialization line INI is connected to the initialization power-source trunk wire via the corresponding diode-connection transistor M4 (in FIG. 9, illustrated as a dynamic load Z). That is, the diode-connection transistors M4 are provided so as to one-to-one correspond to the initialization lines INI.

As described above, although the initialization line INI is shared in the row direction, row selections are made one by one. Hence, when there is a single diode-connection transistor M4 (dynamic load Z) in each initialization line INI, a data voltage can be written into the pixels row by row by using these diode-connection transistors M4 sequentially.

Although FIG. 9 illustrates an example configuration where the initialization power-source trunk wire and the diode-connection transistor M4 are disposed in the frame region of the organic EL display device, the disclosure is not limited to this configuration. For instance, the initialization power-source trunk wire and the diode-connection transistor M4 may be incorporated within the driver IC.

Seventh Embodiment

Figure 10:
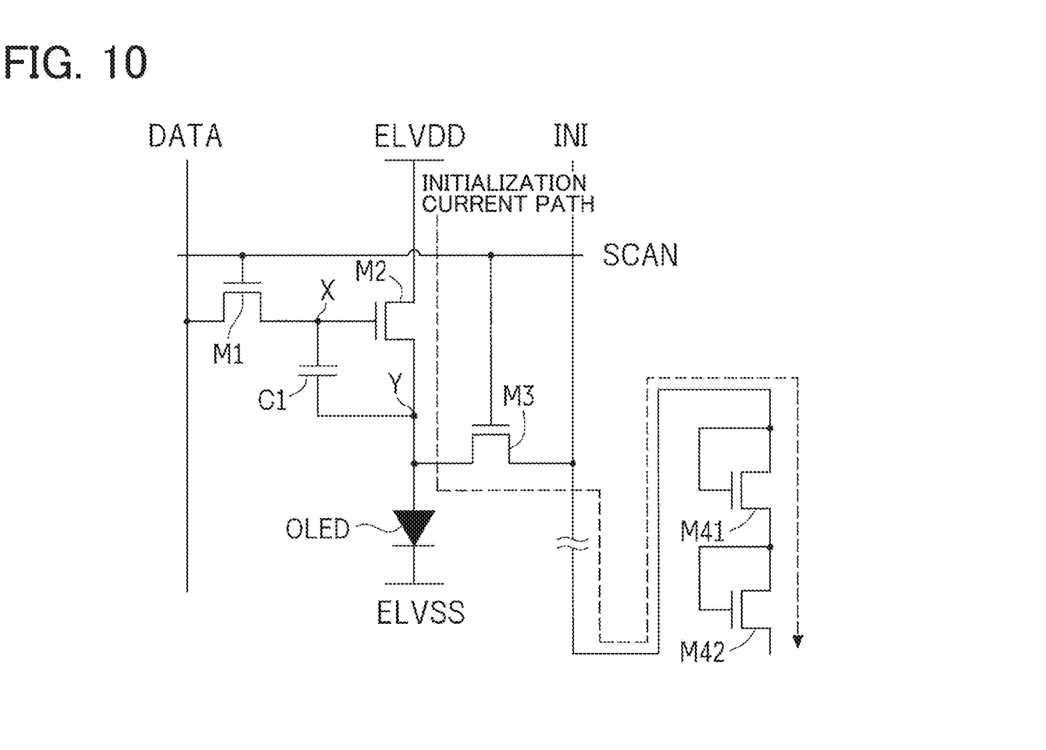
FIG. 10 is a pixel circuit diagram illustrating a pixel of an organic EL display device according to a seventh embodiment.

FIG. 10 is a pixel circuit diagram illustrating a pixel of an organic EL display device according to a seventh embodiment.

The circuit shown in FIG. 10 includes a diode-connection transistor disposed at the proximal end of the initialization line INI, like the circuit shown in FIG. 8. In this configuration as well, such a diode-connection transistor can be a multi-stage diode-connection transistor consisting of the two diode-connection transistors M41 and M42 connected at the proximal end of the initialization line INI, like the configuration in the fourth embodiment. As a matter of course, the number of diode-connection transistors constituting the multi-stage diode-connection transistor is not limited to two; three or more diode-connection transistors may be provided.

In addition to the effect of the circuit shown in FIG. 8, the circuit shown in FIG. 10 can further increase the circuit's S value, like the circuit shown in FIG. 6.

The display devices described in the first to seventh embodiments may be any device that includes a current-driven display element. Examples of the current-driven display element include an organic EL display having organic light-emitting diodes (OLEDs), an inorganic EL display having inorganic light-emitting diodes, and a QLED display having quantum-dot light-emitting diodes (QLEDs).

The foregoing disclosed embodiments are illustrative in all aspects and do not thus constitute a ground for restrictive interpretations. The technical scope of the present disclosure is thus defined by the appended claims rather than by only the foregoing embodiments. In addition, all changes that fall within metes and bounds of the claims, or equivalence of such metes and bounds thereof are embraced by the claims.

The invention claimed is:

1. A display device comprising:
    scanning signal lines;
    data signal lines intersecting with the scanning signal lines;
    initialization power-source lines;
    sub-pixel circuits provided to correspond to points of intersection between the scanning signal lines and the data signal lines; and
    light emitters provided to correspond to the sub-pixel circuit, the scanning signal lines, the data signal lines, the initialization power-source lines, the sub-pixel circuits and the light emitters being arranged in matrix in a display region,
    wherein each of the sub-pixel circuits includes
        a drive transistor,
        a write transistor connecting a corresponding one of the data signal lines and the drive transistor together,
        a capacitor connected to the drive transistor and retaining a data signal, and
        a diode-connection transistor and an initialization transistor both connected between the drive transistor and a corresponding one of the initialization power-source line, and
    the diode-connection transistor or the initialization transistor is connected to the light emitters.

2. The display device according to claim 1, wherein the diode-connection transistor is connected between the initialization transistor and the corresponding initialization power-source line.

3. The display device according to claim 1, wherein the diode-connection transistor is connected between the drive transistor and the initialization transistor.

4. The display device according to claim 1, wherein the corresponding initialization power-source line is connected to a back gate of the drive transistor.

5. The display device according to claim 1, wherein a source of the diode-connection transistor is connected to a back gate of the drive transistor.

6. The display device according to claim 2, wherein a plurality of the diode-connection transistors are arranged between the initialization transistor and the corresponding initialization power-source line.

7. The display device according to claim 3, wherein a plurality of the diode-connection transistors are arranged between the drive transistor and the initialization transistor.

8. A display device comprising:
scanning signal lines;
data signal lines intersecting with the scanning signal lines;
initialization power-source lines;
sub-pixel circuits provided to correspond to points of intersection between the scanning signal lines and the data signal lines; and
light emitters provided to correspond to the sub-pixel circuit, the scanning signal lines, the data signal lines, the initialization power-source lines, the sub-pixel circuits and the light emitters being arranged in matrix in a display region,
wherein each of the sub-pixel circuits includes
a drive transistor,
a write transistor connecting a corresponding one of the data signal lines and the drive transistor together,
a capacitor connected to the drive transistor and retaining a data signal, and
an initialization transistor connected between the drive transistor and a corresponding one of the initialization power-source lines, and
a diode-connection transistor is connected between the corresponding initialization power-source line and an initialization power-source terminal, and
the initialization transistor is connected to the light emitters.

9. The display device according to claim 8, wherein
the initialization power-source lines are arranged so as to be in parallel to and one-to-one correspond to the data signal lines, and
the initialization power-source lines are individually connected to an initialization power-source trunk wire via diode-connection transistors provided so as to one-to-one correspond to the initialization power-source lines.

10. The display device according to claim 8, wherein a plurality of the diode-connection transistors are arranged between the corresponding initialization power-source line and the initialization power-source terminal.

11. The display device according to claim 1, wherein a common one of the scanning signal lines is connected to a data gate of the write transistor and a data gate of the initialization transistor.

12. The display device according to claim 1, further comprising
a scanning drive circuit configured to output a drive signal to the scanning signal lines,
wherein when the data signal is written, the scanning drive circuit inputs a drive signal to a scanning signal line to turn on the write transistor and the initialization transistor, and
when the data signal is written, a source of the drive transistor and the initialization power source are connected together via the diode-connection transistor.

13. A display device comprising:
scanning signal lines;
data signal lines intersecting with the scanning signal lines;
initialization power-source lines;
sub-pixel circuits provided to correspond to points of intersection between the scanning signal lines and the data signal lines; and
light emitters provided to correspond to the sub-pixel circuit, the scanning signal lines, the data signal lines, the initialization power-source lines, the sub-pixel circuits and the light emitters being arranged in matrix in a display region,
wherein each of the sub-pixel circuits includes
a drive transistor,
a write transistor connecting a corresponding one of the data signal lines and the drive transistor together,
a capacitor connected to the drive transistor and retaining a data signal, and
a diode-connection transistor and an initialization transistor both connected between the drive transistor and a corresponding one of the initialization power-source line, and
the corresponding initialization power-source line is connected to a back gate of the drive transistor.

* * * * *